United States Patent [19]

Yang

[11] Patent Number: 5,126,675
[45] Date of Patent: Jun. 30, 1992

[54] BATTERY CAPACITY MONITOR

[76] Inventor: Tai-Her Yang, 5-1 Taipin St., Si-Hu Town, Dzan-Hwa, Taiwan

[21] Appl. No.: 583,235

[22] Filed: Sep. 14, 1990

[51] Int. Cl.$^5$ .......................................... G01N 27/416
[52] U.S. Cl. .................................... 324/435; 324/434; 324/427
[58] Field of Search ............... 324/426, 430, 434, 435, 324/427; 340/636

[56] References Cited

U.S. PATENT DOCUMENTS

| | | | |
|---|---|---|---|
| 4,413,221 | 11/1983 | Benjamin et al. | 324/435 X |
| 4,626,765 | 12/1986 | Tanaka | 340/636 X |

FOREIGN PATENT DOCUMENTS

| | | | |
|---|---|---|---|
| 2742675 | 4/1979 | Fed. Rep. of Germany | 340/636 |
| 0223571 | 10/1986 | Japan | 340/636 |
| 0234379 | 10/1986 | Japan | 340/636 |
| 0235773 | 10/1986 | Japan | 340/636 |
| 2-17281 | 8/1989 | Japan | 324/435 |

*Primary Examiner*—Jack B. Harvey
*Attorney, Agent, or Firm*—Leonard Bloom

[57] ABSTRACT

A simple and inexpensive battery capacity monitor which indicates the remaining capacity of a battery by indirect measurement of the equivalent internal resistance. The monitor momentarily applies an RC load across the battery terminals and indicates the peak capacitive charge which is indicative of the equivalent internal resistance, which in turn can be correlated to the remaining battery capacity.

6 Claims, 2 Drawing Sheets

BATTERY CAPACITY MONITOR

BACKGROUND OF THE INVENTION

1. Field of the Invention

The present invention relates to the measurement of battery capacity by correlation to equivalent internal resistance, and more particularly, to a circuit for indirectly determining the equivalent internal resistance of a battery by momentarily applying an RC load across the battery terminals and measuring the process of RC charging.

2. Description of the Background

One of the most accurate methods for determining battery capacity is by measuring the specific gravity of the electrolyte. Unfortunately, measurement of a battery's specific gravity is a complex and troublesome task. A more practical method is by measuring the equivalent internal resistance of the battery, i.e., determining the reduction in voltage supplied by the battery as a function of load. However, such voltage measurements are prone to great error. Moreover, measurement of a battery's internal resistance requires a complex electrometer which must be capable of applying various low resistance loads directly across the positive and negative terminals of the battery. This results in a great current drain to the battery which consumes power and induces sparking. The temperature of battery and cord rise to extreme temperatures. These conditions make it extremely dangerous for an inexperienced person to conduct the measurement.

SUMMARY OF THE INVENTION

Accordingly, it is an object of the present invention to provide a battery capacity monitor which indirectly determines the equivalent internal resistance of battery by momentarily applying an RC load across the battery terminals and indicating the peak capacitive charge.

It is another object of the present invention to provide a simple and inexpensive battery capacity monitor which eliminates the need to directly measure a full-load voltage drop across battery terminals, thereby conserving power and eliminating sparking.

It is still another object of the present invention to provide a simple and convenient display for indicating battery capacity in terms of a peak capacitive charge.

BRIEF DESCRIPTION OF THE DRAWINGS

Other objects, features and advantages of the present invention will become more apparent from the following detailed description of preferred embodiments and certain modifications thereof when taken together with the accompanying drawings, in which.

DETAILED DESCRIPTION OF THE INVENTION

Figure 1:
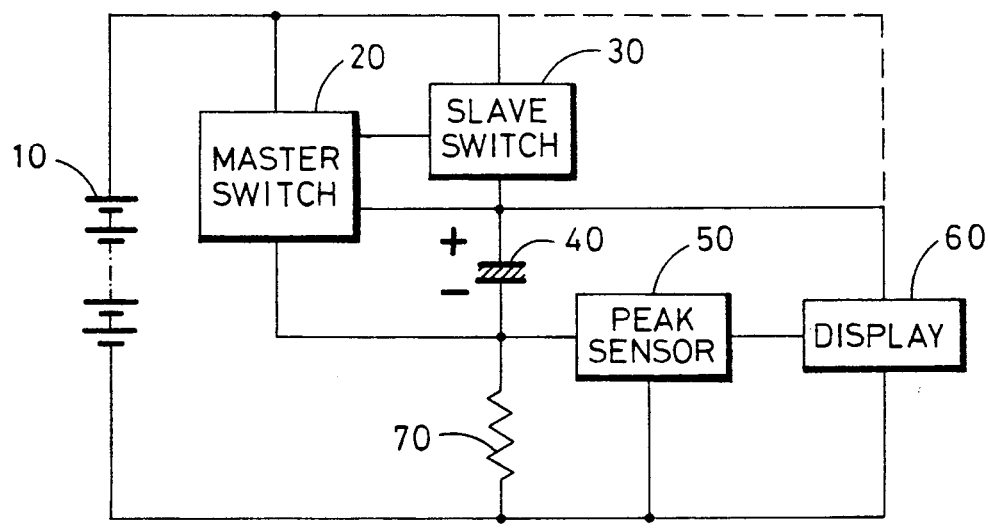
FIG. 1 is a circuit block diagram of a battery capacity monitor for indicating the equivalent internal resistance of a battery in accordance with the present invention.

FIG. 1 shows a circuit block diagram of a battery capacity monitor according to the present invention.

The battery capacity monitor provides an indication of the equivalent internal resistance of a battery 10.

Test load 70 is a suitable resistance chosen in accordance with the internal resistance of the battery to load the battery while the capacity is tested.

Test capacitance 40 is connected in series with test load 70. Test capacitance 40 is a suitable capacitance chosen in accordance with test load 70 to form an RC circuit which charges upon the application of power from battery 10.

A master switch 20 is connected between battery 10 and the series-connected test load 70 and test capacitance 40. Master switch 20 may be any electro-mechanical or solid state switch capable of opening and closing a connection in order to initiate application of the battery 10 to the series-connected test capacitance 40 and test load 70. Master switch 20 must also be capable of short-circuiting the two terminals of test capacitance 40 upon completion of the testing in order to discharge any stored residual charge.

Slave switch 30 may be any switch controlled by master switch 20, which is triggered thereby to complete a connection between battery 10 and the series-connected test capacitance 40 and test load 70. Slave switch 30 is preferably triggered by a pulse from master switch 20, and should be capable of maintaining the connection after the pulse is received. Upon receipt of a pulse from master switch 20, slave switch 30 enables charging of test capacitance 40 by battery 10 through test load 70. Test load 70 limits the amount of current drawn from battery 10 to reduce power drain and prevent sparking.

Peak sensing circuit 50 is connected in parallel with test load 70 to sense the peak value of the voltage applied to test load 70.

Display 60 is connected to peak sensing circuit 50 for indicating the peak value of the voltage falling across test load 70. Preferably, display 60 maintains an indication of the peak voltage across test load 70 even as the actual voltage decreases.

Figure 2:
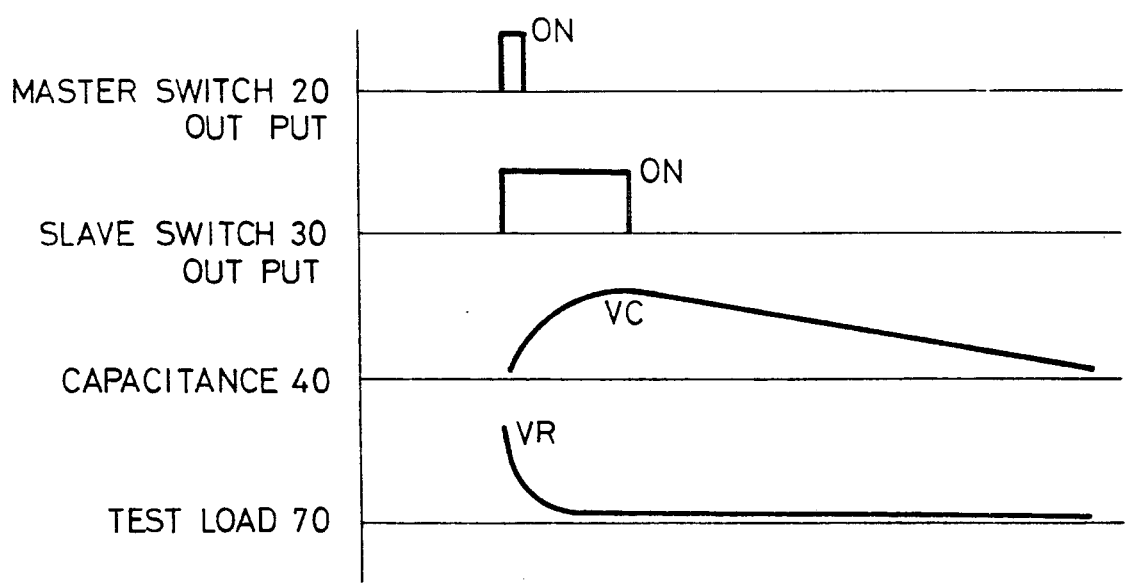
FIG. 2 is a graphical description of the operation of the circuit of FIG. 1.

The operation of the above-described device will now be explained with reference to FIG. 2, which is a composite graph of the electrical signals at various points in the device of FIG. 1. A test of the battery 10 capacity is initiated by momentarily depressing master switch 20. As shown in FIG. 2, a short pulse will be applied to the control input of slave switch 30. Slave switch 30 will be activated to apply battery 10 directly to the series-connected test capacitance 40 and test load 70. At the instant battery 10 is applied there will be very little internal resistance and the full output voltage will fall across test capacitance 40. At first, there will be no voltage drop across test capacitance 40, and the current drawn from battery 10 will be limited only by test load 70. However, as the internal resistance of battery 10 increases, the capacitance 40 will simultaneously begin to charge. Test capacitance 40 will charge in accordance with the internal resistance of the battery 10 because the battery will be under load. Hence, the voltage falling across test load 70 is inversely proportional to the internal resistance of battery 10. The peak voltage value falling across resistance 70 will indicate the remaining capacity. Peak sensor circuit 50 will operate display 60 to maintain a visual indication of the peak voltage value falling across resistance 70.

Figure 3:
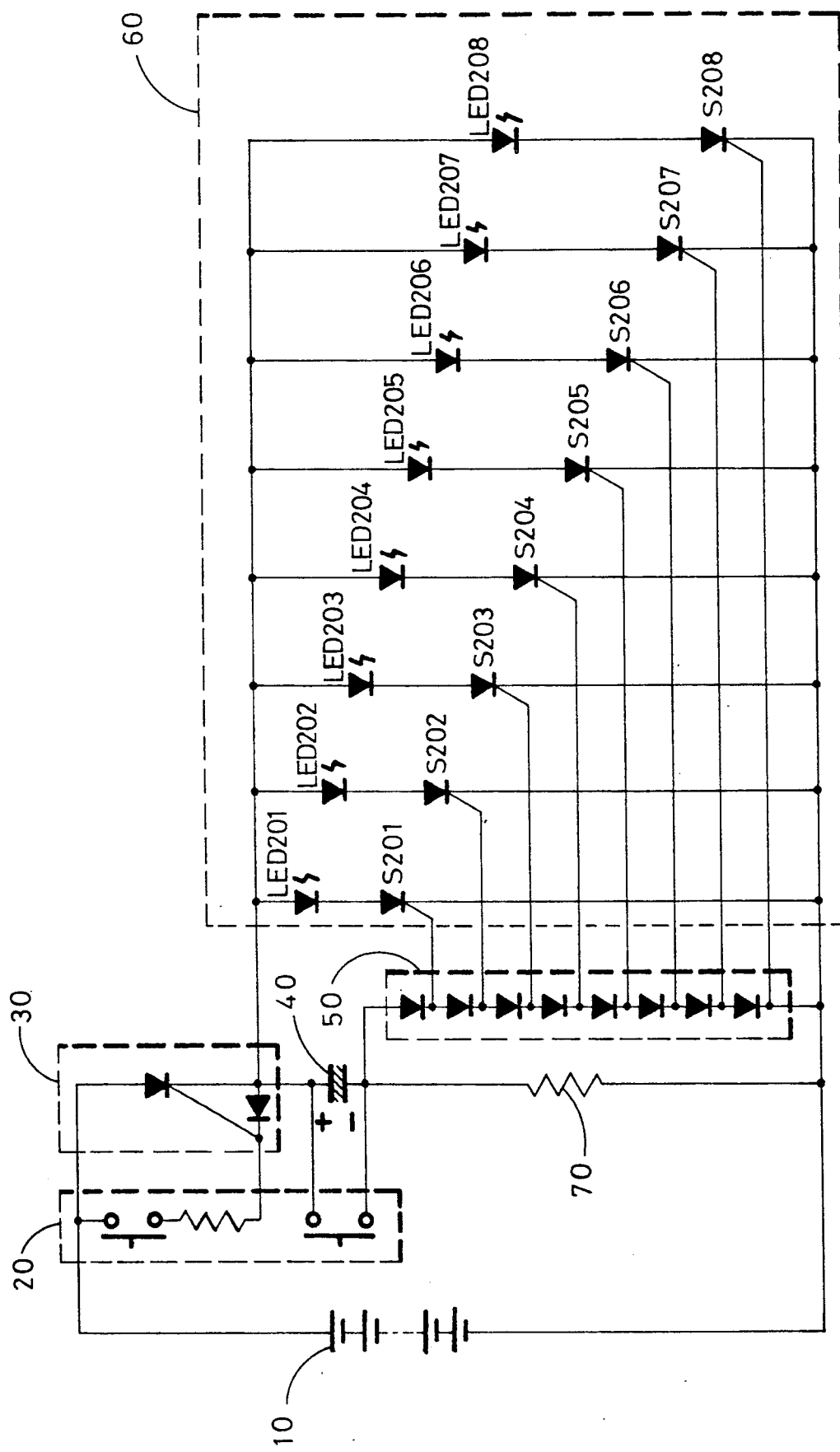
FIG. 3 is a detailed circuit diagram of a preferred embodiment of the battery capacity monitor according to FIG. 1.

FIG. 3 is a detailed circuit diagram of a preferred embodiment of the above-described battery capacity monitor.

Master switch 20 is preferably a pair of manually operated relays M201 and M201'. Upon actuation of relay M201, the battery 10 output will be to slave switch 30, which is preferably a conventional thyristor. Slave switch 30 is connected in series with test capacitance 40 and test load 70, and has a control input connected to battery 10 via relay M201 of master switch 20. Slave switch 30 remains non-conducting in the forward direction until relay M201 of master switch 20 is closed, at which point the battery voltage will be applied to the control input of slave switch 30 to cause it to conduct. Slave switch 30 continues to conduct following the control pulse, and the battery power will be applied across test capacitance 40 and test load 70. This in turn enables charging of test capacitance 40 by battery 10 through test load 70.

Peak sensing circuit 50 is preferably a series of zener diodes connected in parallel with test load 70 to sense the peak value of the voltage applied to test load 70. The diodes of peak sensing circuit 50 should have successively increasing break-down characteristics so that the diodes break down in sequence as the voltage across test load 70 changes.

Display 60 is shown to be a series of thyristors S201-8 each connected in series with a corresponding LED 201-8. the series-connected thyristors S201-8 and LEDs 201-8 each being connected in parallel with the series-connected test capacitance 40 and test load 70. In addition, each thyristor S201-8 has a control input connected to the cathode of a corresponding diode in peak sensor circuit 50. As the voltage across test load 70 changes, the diodes of peak sensor 50 break down in sequence, thereby triggering the respective thyristors S201-8 of display 60. Those of LED 201-8 which are coupled to the triggered thyristors S201-8 will be maintained in an illuminated state to provide a lasting visual indication of the capacity of battery 10.

The display 60 will continue to show the capacity of the battery 10 until relay M201' of master switch 20 is closed, thereby discharging test capacitance 40.

Having now fully set forth the preferred embodiments and certain modifications of the concept underlying the present invention, various other embodiments as well as certain variations and modifications of the embodiment herein shown and described will obviously occur to those skilled in the art upon becoming familiar with said underlying concept. It is to be understood, therefore, that within the scope of the appended claims, the invention may be practiced otherwise than as specifically set forth herein.

I claim:

1. A battery capacity monitor, comprising:
    a test impedance including a series resistor and capacitor, said test impedance being connectable in parallel to a battery to be tested;
    a slave switch for selectively completing a connection between said test impedance and said battery, said slave switch having a trigger input for selecting completion of said connection;
    a master switch connected to said trigger input of said slave switch, a first operation of said master switch triggering said slave switch to complete said connection between said test impedance and said battery;
    a peak sensing circuit connected to said test impedance for sensing a peak voltage across said test impedance resistor, said peak voltage corresponding to a remaining capacity of said battery; and
    a display connected to said peak sensing circuit for maintaining a visual indication of said peak voltage.

2. The battery capacity monitor according to claim 1, wherein said master switch is further connected in parallel across said test impedance capacitor, and a second operation of said master switch discharges said test impedance capacitor.

3. The battery capacity monitor according to claim 2, wherein said display maintains a visual indication of said peak voltage until said second operation of said master switch.

4. The battery capacity monitor according to claim 1, wherein said peak sensing circuit is connected in parallel to said test impedance resistor for sensing said peak voltage.

5. A battery capacity monitor, comprising:
    a test resistor and a charging capacitor connected in series, said test resistor being connected to a (−) terminal of a battery to be tested;
    a slave switch for selectively connecting said charging capacitor to a (+) terminal of said battery, said slave switch having a trigger input for initiating said selection;
    a first master relay connected between the (+) terminal of said battery and said trigger input of said slave switch, whereby closing of said first master relay applies battery power to said trigger input for initiating said slave switch to connect said series-connected resistor and capacitor in parallel to said battery;
    a second master relay connected in parallel across said charging capacitor, whereby closing of said relay discharges said capacitor;
    a peak sensing circuit comprising a plurality of series-connected zener diodes connected in parallel across said test resistor for sensing a peak voltage occurring across said test resistor, said peak voltage corresponding to a remaining capacity of said battery; and
    a display connected to said peak sensing circuit for maintaining a visual indication of said peak voltage, said display further comprising a plurality of pairs of series-connected LEDs and thyristors, each pair being connected in parallel between said slave switch and the (−) terminal of said battery, and each thyristor having an enable input connected to a cathode of a corresponding zener diode of said peak sensing circuit.

6. The battery capacity monitor according to claim 5, wherein successive ones of said zener diodes in said peak sensing circuit break down in accordance with said peak voltage, thereby enabling said corresponding thyristor in said display to illuminate said series-connected LED.

* * * * *